United States Patent [19]

Suzuki et al.

[11] 3,935,117
[45] Jan. 27, 1976

[54] PHOTOSENSITIVE ETCHING COMPOSITION

[75] Inventors: Gyoji Suzuki; Takeshi Tomotsu, both of Asaka, Japan

[73] Assignee: Fuji Photo Film Co., Ltd., Minami-ashigara, Japan

[22] Filed: Nov. 26, 1973

[21] Appl. No.: 419,010

Related U.S. Application Data

[63] Continuation-in-part of Ser. No. 174,825, Aug. 25, 1971.

[30] Foreign Application Priority Data

Aug. 25, 1970 Japan.............................. 45-74488

[52] U.S. Cl.................... 252/79.1; 96/36; 96/36.2; 96/88; 156/4; 156/15
[51] Int. Cl.²................... C03C 15/00; C09K 13/00; G03C 5/00
[58] Field of Search.......................... 252/79.1–79.4; 156/4, 7, 9, 15, 16, 17, 24; 96/36, 36.2, 88, 114

[56] References Cited
UNITED STATES PATENTS

| 3,346,384 | 10/1967 | Gaynor | 96/36 |
|---|---|---|---|
| 3,485,630 | 12/1969 | Burgess et al. | 96/36 |
| 3,489,564 | 1/1970 | Schaefer | 96/36 |
| 3,520,684 | 7/1970 | Metlay et al. | 96/36 |
| 3,520,685 | 7/1970 | Schaefer | 96/36 |
| 3,520,687 | 7/1970 | Schaefer | 96/36 |

*Primary Examiner*—William A. Powell
*Attorney, Agent, or Firm*—Sughrue, Rothwell, Mion, Zinn & Macpeak

[57] ABSTRACT

A method of forming patterns on a semiconductor element is disclosed comprising the steps of (a) depositing a coating of silicon nitride, borosilicate glass, or phosphosilicate glass on the surface of a semiconductor substrate, (b) applying a photosensitive etching solution layer to the coating and drying it, (c) irradiating the substrate with ultraviolet radiation through a photomask having a required pattern to decompose the photosensitive solution and etch the coating, and (d) removing the photosensitive solution, the decomposed material, and the reaction product of the decomposed material and the coating with an organic solvent. The photosensitive etching solution consists of a compound which may be decomposed by light to a material which etches the coating, or a compound obtained from the reaction between the photodecomposed material and other material in the solution which etches said coating.

3 Claims, 4 Drawing Figures

INVENTORS
GYOJI SUZUKI
TAKESHI TOMOTSU

BY Sughrue, Rothwell, Mion, Zinn & Macpeak

ATTORNEYS

PHOTOSENSITIVE ETCHING COMPOSITION

This application is a continuation-in-part of serial No. 174,825, filed Aug. 25, 1971.

BACKGROUND OF THE INVENTION

1. Field of the Invention

This invention relates to a method for fabricating semiconductor devices, and more specifically to a method for forming patterns for semiconductor elements on a silicon semiconductor substrate having a protective coating.

2. Description of the Prior Art

It is generally well known to those skilled in the art that, in the processes of fabricating a transistor or IC, patterns are formed on the semiconductor substrate or on the protective coating of the semiconductor element.

The most generally used method for forming patterns is as follows: a substrate of silicon, germanium, or other similar semiconductor material is first oxidized to form the silicon dioxide coating on the surface of the substrate by heating it in an atmosphere containing oxygen. A layer of a photosensitive material, such as, for example, a photosensitive polymer (photoresist) is next applied to the dioxide surface. An opaque mask is then applied to the element to block off the edge areas and the unmasked areas are exposed to actinic radiation such as ultraviolet light and hardened. The unexposed areas of the photoresist are removed with an organic solvent, and thus the silicon dioxide surface is exposed. The element is now heated to harden the irradiated areas and then the entire substrate is treated with an etching solution, such as hydrofluoric acid to dissolve the exposed silicon dioxide surface uncovered with the photoresist. Afterwards the hardened photoresist above is removed with an organic solvent. Subsequently the diffusion processes of another metal material is applied to the uncovered surface portions of the element.

The photolithographic operation described above is generally known to those skilled in the art as the photoetching technique. In fabricating a semiconductor device, several diffusion process operations are applied, depending upon the type of the semiconductor device. It is, therefore, required to repeat the cycles of applying photosensitive material, exposing, developing, etching the dioxide coating, removing the unexposed portion of the photosensitive material, and diffusion process each time, and accordingly much time and high grade technique is required to practice these operations. In addition, these procedures have a disadvantage in that the hardened portions may be damaged by the operation of removing the unhardened portions.

To eliminate these disadvantages, there have been disclosed several improved photoetching techniques, for example, as described in U.S. Pat. No. 3,095,332; No. 3,095,341; No. 3,122,463; No. 3,255,005; No. 3,346,384; No. 3,471,291; No. 3,489,564; No. 3,494,768 and French Pat. No. 1,394,467.

Directing our attention to the method of forming patterns on the silicon dioxide coating of a silicon semiconductor material, which is disclosed in the aforementioned patent specifications, a silicon slice having silicon dioxide coating is disposed in a particular ambient of a composition which is decomposed by light into the material which etches the silicon dioxide, and exposed to ultraviolet radiation through the photomask having a required pattern for etching the silicon dioxide coating to form the pattern with a suitable depth. That is, the exposure and etching are practiced simultaneously.

To explain this more specifically, a silicon slice having a silicon dioxide coating is disposed in a gaseous ambient of a fluorine compound, such as $F_2O$ (difluoroxide), the fluorine of which may be set free by exposure, and exposed to actinic radiation through photomask, or while being exposed in a gaseous ambient of a fluorine compound, such as fluorobenzene, the silicon slice is cooled to form a liquid state film of fluorobenzene on the surface of the silicon dioxide coating, and, subsequently, exposed to actinic radiation through the photomask.

In this method, however, as the fluorine compound is supplied continuously between the photomask and the silicon dioxide coating, it is very difficult to initiate a reaction between the product of the photodecomposition or fluorine, which is in a fluid state, in the entire surface of the pattern uniformly in a short time. Moreover, it is also difficult to obtain an etched configuration having a sharp line definition.

In the case of forming a liquid state film and irradiating light thereof, considering the surface tension between the liquid and the silicon dioxide coating, and maintaining the liquid state film on the surface of the silicon dioxide coating, problems prevail. For example, there is the problem of how to accomplish the cycle of liquefying the unexposed gas and removing the liquid state film, including the fluorine reacted with the silicon oxide in the entire surface to be etched uniformly, and how to make an apparatus for achieving the same. It is, therefore, readily understood that, according to this method, it is difficult to form accurate patterns due to the fact that the light for exposure is scattered by the gas and liquid flowing between the photomask and the silicon dioxide coating, and it is especially difficult to obtain exceedingly accurate microscopic patterns, which are required for fabricating IC or LSI.

SUMMARY OF THE PRESENT INVENTION

Therefore, an object of this invention is to provide an improved method of fabricating semiconductor devices.

Another object of the invention is to provide an improved process for selectively etching a diffusion resistant overlayer for leaving a diffusion resistant mask of a prescribed configuration suitable for monitoring a subsequent diffusion of the conductivity-type determining, or significant, impurities into a semiconductor substrate.

A further object of this invention is to provide a process for reproducing a pattern directly on a layer of a material without the necessity for a negative-positive procedure, typical of the photolithographic process.

A further object of the invention is to provide an improved method for forming a pattern in which a single coating layer consisting of silicon nitride, borosilicate glass, and phosphosilicate glass, or a mixture coating layer comprising more than two materials thereof is deposited on a silicon substrate, and a photosensitive etching solution which may be decomposed into its components by irradiation of light is applied to the surface of the coating layer. The decomposed component or the material obtained from the reaction of the component with other material etches the coating layer. The photosensitive etching solution is then dried into a solid state film, and subsequently, the photosensitive etching solution layer is exposed to radiation through a photomask of a prescribed configuration to form a pattern of the coating layer having suitable depth with the result that the silicon substrate is uncovered in the exposed portion, and the pattern of the coating is formed in the unexposed portion, which is necessary for fabricating semi-conductor devices.

Still another object of the present invention is to provide a photosensitive etching solution in a solid state film for accomplishing the objects described above.

Accordingly, a feature of this invention is in performing exposure in the state where the photosensitive etching solution is applied to the coating layer of silicon nitride, borosilicate glass, or phosphosilicate glass and the applied photosensitive etching solution is in the state of a solid coating where the solvent is removed thermally or spontaneously. In some cases, however, the applied photosensitive etching solution requires an adequate amount of hygroscopic moisture to activate the reaction between the decomposed material and the coating.

Another feature of this invention resides in the method of exposure in which as in the conventional photoetching method, the photomask having a required pattern is disposed in intimate contact with the solid film of the photosensitive etching solution, or the pattern of the photomask is projected, and the photosensitive etching solution film is set in the position where the projected image is focused; that is, so called projection exposure may be utilized. Thus, the apparatus for practicing them is simple and easy to handle.

In accordance with this invention, since the photosensitive etching solution for etching the coating of silicon nitride, borosilicate glass, or phosphosilicate glass is, as is described above, previously applied to the coating by a suitable applying apparatus, no supply of new photosensitive etching solution is required during exposure. Consequently the resulting pattern accuracy will not be affected by the wettability of the photosensitive etching solution to the coating as compared with exposing to the liquid state film of photosensitive etching solution, or alternatively, according to this invention, as the photosensitive etching solution is in the state of solid film which is not fluid, the etched pattern having accurate line definition may be obtained.

Further, it is characterized that in case of etching silicon nitride, borosilicate glass or phosphosilicate glass in accordance with the photosensitive etching solution of the present invention, the side etching of them is quite little as compared with the in case of etching silicon oxide.

BRIEF DESCRIPTION OF THE DRAWINGS

Further objects and features of this invention will be understood more fully from the following detailed description taken in connection with the accompanying drawings, wherein.

DETAILED DESCRIPTION OF THE INVENTION

Figure 1:
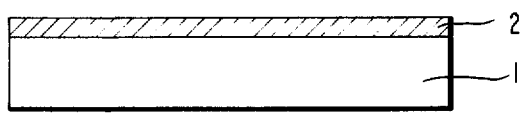
FIG. 1 illustrates the first step of the process and is a side view of a silicon substrate with a layer of silicon nitride, borosilicate glass, of phosphosilicate glass on one side thereof.

In accordance with this invention, a so called N-type or P-type of silicon semiconductor material is used as a substrate, and a protective coating is formed thereon utilizing a desired process, such as, for example, heating the silicon substrate slice in the presence of a suitable amount of nitrogen so that a surface coating of silicon nitride is deposited.

In the case of utilizing germanium as a substrate material, a silicon nitride coating may be obtained by gas phase growth of tetrachlorosilane or tetrahydroxilane with ammonia gas. Other coatings including silicon may be obtained from borosilicate glass or phosilicate glass.

The resulting coating formed by the method described above will protect and stabilize the surface of the silicon substrate as well as mask the prescribed portion when the selective diffusion of a donor or acceptor is practiced. The coating may also be utilized to make windows through which electrodes are attached in a procedure of fabricating semiconductor devices.

A layer of photosensitive etching solution is next applied to the surface of the coating of the substrate. The composition of the photosensitive etching solution comprises (1) a compound which may be decomposed by irradiation of light into a material which etches the coating, or a compound obtained from reaction between the photodecomposed material and other material in the solution which etches said coating, (2) binder, and (3) solvent.

Suitable decomposable compounds include tritylfluoroamine, tetraflurohydrazine, tri-n-butyl-tin-fluoride, $\alpha, \alpha, \alpha$, trifluorotoluene, fluorobenzene, fluorosulphonylbenzenesulphonyl chloride, mono fluoroacetone, 4,4'-fluorobenzophenone, methanesulphonylfluoride, 1-fluro-2-propanol, hexafluorobenzene, trityldifluoroamine, fluoranyl, trifluoriodomethane, trifluorotrichloroethane, P, P'-difluorodiphenylsulphone. Suitable solvents include benzene, acetone, xylene, toluene, and alcohol. As a binder, conventional resins, such as polystyrene and polyvinylalcohol may be utilized.

The photosensitive etching solution may be applied to the coating by well known methods, such as the dip method or spinner method in the dark. Then, the applied coating of the photosensitive etching solution is dried by suitable means. The photosensitive etching solution layer is next exposed with ultraviolet or infrared light through a photomask having a required pattern in a suitably wet ambient with the result that the photosensitive etching solution in the exposed portion is decomposed and the resulting material etches the coating layer and thus, the coating layer disappears.

Giving an example where the resulting material of photo-decomposition reacts with other material to etch the coating layer, a photo-sensitive etching solution comprising trityldifluoroamine as fluoride, polystyrene as binder, and benzene as solvent is a good example thereof.

Being exposed, trityldifluoroamine liberates fluorine which reacts with the hydrogen from the polystyrene to make hydrogen fluoride. This hydrogen fluoride etches the coating layer in a suitably wet ambient. The unexposed portion of the photosensitive etching solution and the resulting material of the reaction between the photodecomposed material and the coating layer are then washed or dissolved away with water or an organic solvent, and thus, the substrate is uncovered in the exposed portion.

DETAILED DESCRIPTION OF THE DRAWINGS

Figure 2:
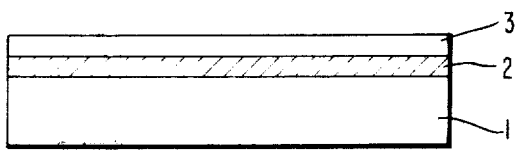
FIG. 2 illustrates the second step and shows the silicon sibstrate with a layer of a photosensitive etching solution applied and dried to the surface of the coating layer.
Figure 3:
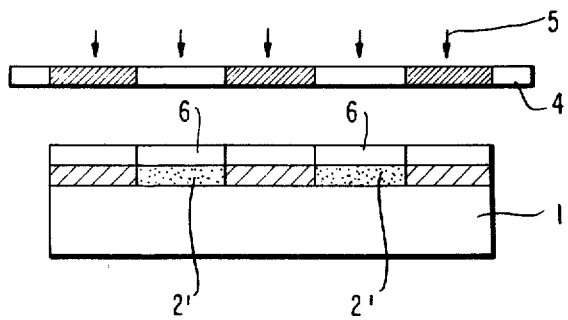
FIG. 3 illustrates the third step of the process and shows irradiation for the unmasked portion one side of the silicon substrate and etching the coating layer.
Figure 4:
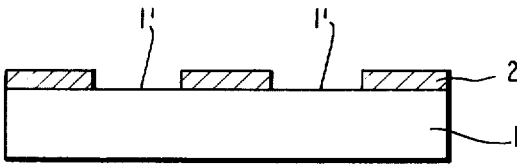
FIG. 4 illustrates a side view of the resulting substrate after finished etching.

Referring now to the drawings, a silicon substrate 1 is employed to fabricate the semiconductor device. The silicon substrate 1 is first coated with silicon nitride, borosilicate glass, or phosphosilicate glass to form a coating layer 2 on the surface of the substrate 1 (shown in FIG. 1). A layer of photosensitive etching solution 3 is next applied to the surface of the coating layer 2 and dried (shown in FIG. 2). The photosensitive etching solution in solid state is then exposed to actinic radiation 5, such as ultraviolet light through a photomask 4 having a required pattern (shown in FIG. 3). The radiated areas 6 of the photosensitive etching solution is decomposed and the photo-decomposed material etches the coating layer 2'. The photosensitive etching solution layer 3, the photo-decomposed material and the resulting material of reaction between the photodecomposed material and the coating 2 are next dissolved away with an organic solvent, and thus the silicon substrate 1' is uncovered.

It is characterized that in case of etching silicon nitride, borosilicate glass or phosphosilicate glass in accordance with the photosensitive etching solution of the present invention, the side etching of them is quite lettle as compared with that in case of etching silicon oxide.

The detailed explanation of the above is as follows;

A photosentive etching solution composed of 6g of p,p -difluorophenylsulfone, 6g of polystyrene (molecular weight: about 20,000), 5g of benzene and 1g of acetone was applied to a silicon nitride layer (thickness : 1000A) provided on a silicon slice having a diameter of 30mm by means of a spinner coating device rotating at 4000 r.p.m., and then allowed to stand for 15 minutes at 60°C to obtain a dry photosensitive etching layer having a thickness of 20 microns. The dry photosensitive etching layer, which was then contacted with a photomask, was exposed to a 100 W high-pressure mercury lamp. By the exposure of 1 minute 40 seconds, the silicon nitride layer corresponding to patterns of photomask was completely etched. In this case, the side etching in the width of 100 $\mu$ delated by etching is 70A. On the other hand, when the photosensitive etching solution was coated and then dried as the same manner as the above with the exception of using silicon oxide (thickness : 1000A) instead of silicon nitride, the etching was completely effected during 60 seconds, and the side etching is 100A. From this result, it is recognized that the photosentive etching solution applied to a silicon nitride in this invention is superior to that applied to a silicon oxide since the side etching is less.

From the foregoing, it is readily appreciated that a pattern for a semiconductor device having a protective coating may be formed on the substrate thereof in an easy manner by utilizing the photosensitive etching solution in accordance with this invention, and thus, it is possible to obtain a highly accurate microscopic pattern required for fabricating a transistor or IC.

The foregoing disclosure and drawings are merely illustrative of the principles of this invention and are not to be interpreted in a limiting scope.

While the present invention has been adequately discussed in the foregoing specification and examples included therein, it is readily apparent that various changes and modifications can be made without departing from the spirit and scope thereof.

What is claimed is:

1. A photosensitive etching solution for fabricating a semiconductor device, employing a coating of silicon nitride, borosilicate glass, or phosphosilicate glass, provided on a silicon semiconductor substrate which comprises:

1. a compound which is capable of being decomposed by light to liberate a material which etches said coating, said decomposable compound being selected from the group consisting of tritylfluoramine, tetrafluorohydrazine, tri-n-butyl-tin-fluoride, $\alpha$, $\alpha$, $\alpha$, trifluorotoluene, trifluoriodomethane, trifluorotrichloroethane, and p,p'-difluorodiphenylsulphone or a compound obtained from the reaction between the photodecomposed material and other material in the solution which etches said coating,
  2. a binder, and
  3. a solvent.

2. The photosensitive etching solution of claim 1, wherein said solvent is a member selected from the group consisting of benzene, acetone, xylene, toluene, and alcohol.

3. The photosensitive etching solution of claim 1, wherein said binder is a member selected from the group consisting of polystyrene and polyvinyl alcohol.

* * * * *